(12) United States Patent
Nirschl

(10) Patent No.: US 7,880,160 B2
(45) Date of Patent: Feb. 1, 2011

(54) MEMORY USING TUNNELING FIELD EFFECT TRANSISTORS

(75) Inventor: Thomas Nirschl, Essex Junction, VT (US)

(73) Assignee: Qimonda AG, Munich (DE)

( * ) Notice: Subject to any disclaimer, the term of this patent is extended or adjusted under 35 U.S.C. 154(b) by 88 days.

(21) Appl. No.: 11/438,450

(22) Filed: May 22, 2006

(65) Prior Publication Data

US 2007/0267619 A1 Nov. 22, 2007

(51) Int. Cl.
*H01L 29/04* (2006.01)
(52) U.S. Cl. .................. 257/5; 257/3; 257/E21.403; 257/24; 257/12; 438/197; 438/301; 365/163; 365/182
(58) Field of Classification Search .............. 257/3, 257/24, 537, E27.07, 5, 12, E21.403, 106, 257/E29.179; 365/148, 163, 54, 131, 158, 365/182; 438/95, 163, 182
See application file for complete search history.

(56) References Cited

U.S. PATENT DOCUMENTS

| | | | |
|---|---|---|---|
| 4,997,783 A | 3/1991 | Hsu | |
| 5,185,275 A | 2/1993 | Prall | |
| 6,291,859 B1 * | 9/2001 | Litwin et al. | 257/368 |
| 6,917,083 B1 | 7/2005 | Violette et al. | |
| 2005/0270832 A1 | 12/2005 | Chu et al. | |
| 2006/0033145 A1 * | 2/2006 | Kakoschke et al. | 257/315 |
| 2007/0246753 A1 * | 10/2007 | Chu et al. | 257/288 |
| 2007/0274136 A1 * | 11/2007 | Takemura et al. | 365/189.05 |
| 2008/0105862 A1 * | 5/2008 | Lung et al. | 257/4 |

OTHER PUBLICATIONS

Nirschl, T et al, Scaling Properties of the Tunneling Field Effect Transistor (TFET): Device and Circuit, published online Dec. 27, 2005, Solid-State Electronics, vol. 50, pp. 44-51.*
Sterkel, M. et al., "Characteristics And Optimisation Of Vertical And Planar Tunneling-FETs,"pp. 15-18, Journal of Physics: Conference Series 10 2005 (2005).

* cited by examiner

*Primary Examiner*—David Vu
*Assistant Examiner*—Suberr Chi
(74) *Attorney, Agent, or Firm*—Dicke, Billig & Czaja, PLLC

(57) ABSTRACT

A memory includes a first tunneling field effect transistor including a first drain and a first source, the first drain coupled to a first resistive memory element. The memory includes a second tunneling field effect transistor including a second drain and sharing the first source, the second drain coupled to a second resistive memory element. The memory includes a first region coupled to the first source for providing a source node.

4 Claims, 4 Drawing Sheets

MEMORY USING TUNNELING FIELD EFFECT TRANSISTORS

CROSS-REFERENCE TO RELATED APPLICATIONS

This Utility patent application is related to U.S. patent application Ser. No. 10/918,335 entitled "INTEGRATED MEMORY DEVICE AND PROCESS", filed Aug. 13, 2004, which is incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

For data storage applications, reducing the physical memory cell size is a continuing goal. Reducing the physical memory cell size increases the storage density of the memory and reduces the cost of the memory.

For these and other reasons, there is a need for the present invention.

SUMMARY

One embodiment of the present invention provides a memory. The memory includes a first tunneling field effect transistor including a first drain and a first source, the first drain coupled to a first resistive memory element. The memory includes a second tunneling field effect transistor including a second drain and sharing the first source, the second drain coupled to a second resistive memory element. The memory includes a first region coupled to the first source for providing a source node.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
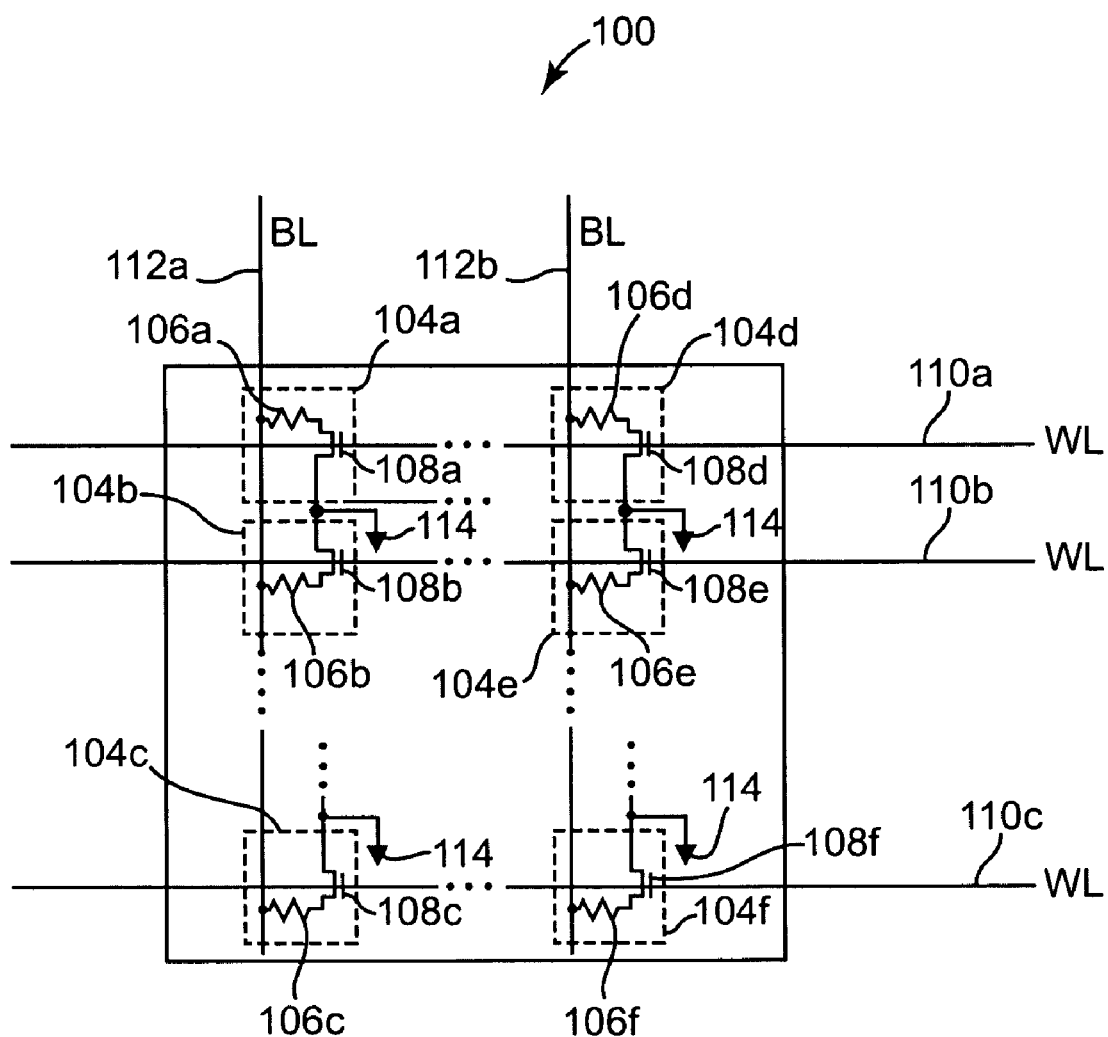
FIG. 1 is a diagram illustrating one embodiment of an array of resistive memory cells.

FIG. 1 is a diagram illustrating one embodiment of an array of resistive memory cells 100. In one embodiment, the resistive memory cells are phase change memory cells. In another embodiment, the resistive memory cells are conductive-bridging random access memory (CBRAM) cells, magneto-resistive random access memory (MRAM) cells, electrolyte memory cells, or other suitable memory cells that store data as resistance values. While the invention will be described with reference to resistive memory cells including phase change elements, the invention also applies to resistive memory cells including CBRAM elements, MRAM elements, or electrolyte elements.

Memory array 100 includes a plurality of phase change memory cells 104a-104f (collectively referred to as phase change memory cells 104), a plurality of bit lines (BLs) 112a-112b (collectively referred to as bit lines 112), a plurality of word lines (WLs) 110a-110c (collectively referred to as word lines 110), and a ground plate 114. Memory cells 104 use tunneling field effect transistors (TFETs). TFETs are similar to metal-oxide-semiconductor field effect transistors (MOSFETs) except for the doping of the source extension. For n-channel MOSFETs, the drain and source extensions are n+ doped. In contrast, for TFETs the drain extension is n+ doped and the source extension is p+ doped. A positive gate bias applied to a TFET forms a reverse biased tunneling junction (i.e., a Zener diode) at the source to channel interface. After both regions are degenerated, carrier generation by band-to-band tunneling starts. TFET devices are compatible with complementary metal-oxide-semiconductor (CMOS) processing techniques.

Adjacent TFETs for adjacent memory cells share a source extension. The shared source extension is coupled to a global p+ region, which acts as a source node or ground plate. With the shared source extension coupled to the ground plate, a contact to the shared source extension to connect source lines or ground lines of adjacent memory cell is not used. Therefore, the distance between adjacent TFETs and word lines 110 coupled to the TFETs can be reduced. The reduced distance between word lines 110 reduces the overall memory array size and increases the storage density of the memory array.

In addition, in an off-state, a smaller static leakage current flows through a TFET as compared to a standard MOSFET with the same dimensions. The leakage current is reduced since the TFET operates differently from a MOSFET in the off-state. The MOSFET presents a reverse biased n+ p diode that is controlled by the gate bias. For short channel lengths, several mechanisms arise increasing the static leakage current (e.g. DIBL, direct tunneling, etc.). For TFETs, a reverse biased junction diode limits the static leakage current since the absence of carriers determines the static leakage current of the diode.

As used herein, the term "electrically coupled" is not meant to mean that the elements must be directly coupled together and intervening elements may be provided between the "electrically coupled" elements.

Each phase change memory cell 104 in memory array 100 is electrically coupled to a word line 110, a bit line 112, and ground plate 114. For example, phase change memory cell 104a is electrically coupled to bit line 112a, word line 110a, and ground plate 114. Phase change memory cell 104b is electrically coupled to bit line 112a, word line 110b, and ground plate 114. Phase change memory cell 104c is electrically coupled to bit line 112a, word line 110c, and ground plate 114. Phase change memory cell 104d is electrically coupled to bit line 112b, word line 110a, and ground plate 114. Phase change memory cell 104e is electrically coupled to bit line 112b, word line 110b, and ground plate 114, and phase change memory cell 104f is electrically coupled to bit line 112b, word line 110c, and ground plate 114.

Each phase change memory cell 104 includes a phase change element 106 and a TFET 108. In other embodiments, each memory cell 104 includes a CBRAM element 106, MRAM element 106, electrolyte element 106, or other suitable resistive memory element 106. Phase change memory cell 104a includes phase change element 106a and TFET 108a. One side of phase change element 106a is electrically coupled to bit line 112a, and the other side of phase change element 106a is electrically coupled to the drain of TFET 108a. The source of TFET 108a is electrically coupled to ground plate 114. The gate of TFET 108a is electrically coupled to word line 110a. Phase change memory cell 104b includes phase change element 106b and TFET 108b. One side of phase change element 106b is electrically coupled to bit line 112a, and the other side of phase change element 106b is electrically coupled to the drain of TFET 108b. The source of TFET 108b is electrically coupled to ground plate 114. The source of TFET 108b is shared with the source of TFET 108a. The gate of TFET 108b is electrically coupled to word line 110b.

Phase change memory cell 104c includes phase change element 106c and TFET 108c. One side of phase change element 106c is electrically coupled to bit line 112a, and the other side of phase change element 106c is electrically coupled to the drain of TFET 108c. The source of TFET 108c is electrically coupled to ground plate 114. The source of TFET 108c is shared with the source of an adjacent TFET (not shown). The gate of TFET 108c is electrically coupled to word line 110c.

Phase change memory cell 104d includes phase change element 106d and TFET 108d. One side of phase change element 106d is electrically coupled to bit line 112b, and the other side of phase change element 106d is electrically coupled to the drain of TFET 108d. The source of TFET 108d is electrically coupled to ground plate 114. The gate of TFET 108d is electrically coupled to word line 110a. Phase change memory cell 104e includes phase change element 106e and TFET 108e. One side of phase change element 106e is electrically coupled to bit line 112b, and the other side of phase change element 106e is electrically coupled to the drain of TFET 108e. The source of TFET 108e is electrically coupled to ground plate 114. The source of TFET 108e is shared with the source of TFET 108d. The gate of TFET 108e is electrically coupled to word line 110b.

Phase change memory cell 104f includes phase change element 106f and TFET 108f. One side of phase change element 106f is electrically coupled to bit line 112b, and the other side of phase change element 106f is electrically coupled to the drain of TFET 108f. The source of TFET 108f is electrically coupled to ground plate 114. The source of TFET 108f is shared with the source of an adjacent TFET (not shown). The gate of TFET 108f is electrically coupled to word line 110c.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

During a set operation of phase change memory cell 104a, a set current or voltage pulse is selectively enabled and sent through bit line 112a to phase change element 106a thereby heating it above it's crystallization temperature (but usually below it's melting temperature) with word line 110a selected to activate TFET 108a. In this way, phase change element 106a reaches its crystalline state during this set operation. During a reset operation of phase change memory cell 104a, a reset current or voltage pulse is selectively enabled to bit line 112a and sent to phase change element 106a. The reset current or voltage quickly heats phase change element 106a above its melting temperature. After the current or voltage pulse is turned off, phase change element 106a quickly quench cools into the amorphous state. Phase change memory cells 104b-104f and other phase change memory cells 104 in memory array 100 are set and reset similarly to phase change memory cell 104a using a similar current or voltage pulse.

Figure 2:
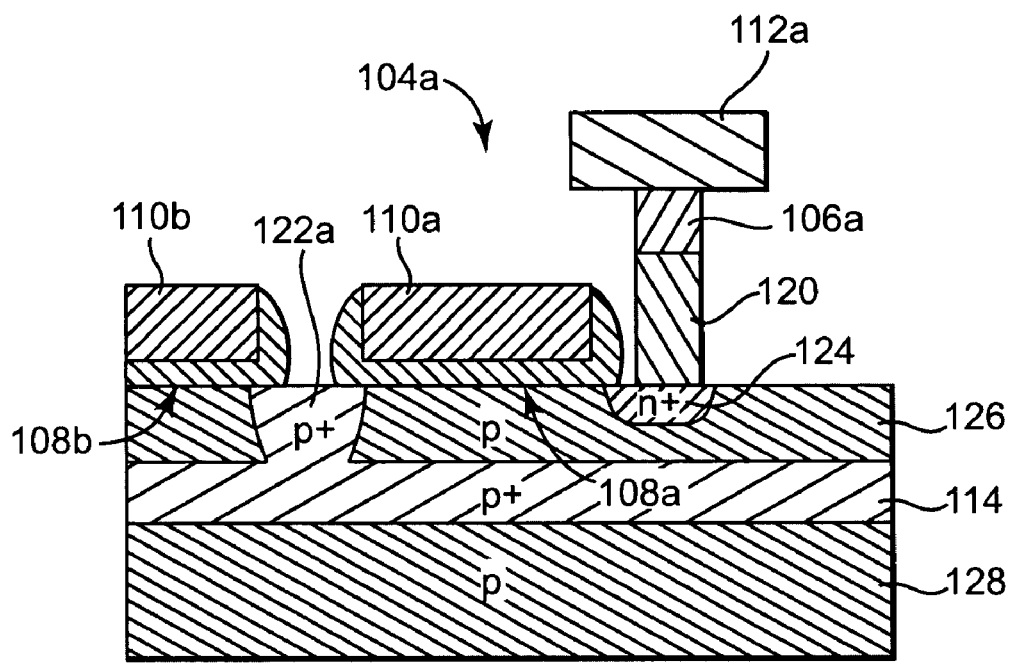
FIG. 2 is a diagram illustrating one embodiment of a phase change memory cell.

FIG. 2 is a diagram illustrating one embodiment of phase change memory cell 104a and a portion of phase change memory cell 104b. In one embodiment, each phase change memory cell 104 in memory array 100 is similar to the embodiment of phase change memory cell 104a illustrated in FIG. 2. Phase change memory cell 104a includes bit line 112a, phase change element 106a, contact 120, TFET 108a including source 122a and drain 124, word line 110a, and a substrate including p region 126, p+ source or ground plate region 114, and p region 128. The portion of memory cell 104b illustrated includes a portion of TFET 108b including source 122a, and word line 110b. Bit line 112a is electrically coupled to one side of phase change element 106a. The other side of phase change element 106a is electrically coupled to one side of contact 120. The other side of contact 120 is electrically coupled to drain 124 of TFET 108a. Source 122a of TFET 108a is shared with TFET 108b. Word line 110a is electrically coupled to the gate of TFET 108a, and word line 110b is electrically coupled to the gate of TFET 108b. TFET 108a and TFET 108b are formed in p region 126. Source 122a is p+ doped and drain 124 is n+ doped. P+ ground plate region 114 is adjacent p region 126, and p region 128 is adjacent p+ ground plate region 114.

Source 122a of TFET 108a and TFET 108b extends to and contacts p+ region 114. P+ region 114 acts as a source node or ground plate such that no additional source line or ground line and the associated contact to source 122a is used between word line 110a and word line 110b for coupling adjacent sources. Therefore, word lines 110a and 110b can be positioned closer together to reduce the overall memory array size and increase the storage density for the memory array.

Figure 3:
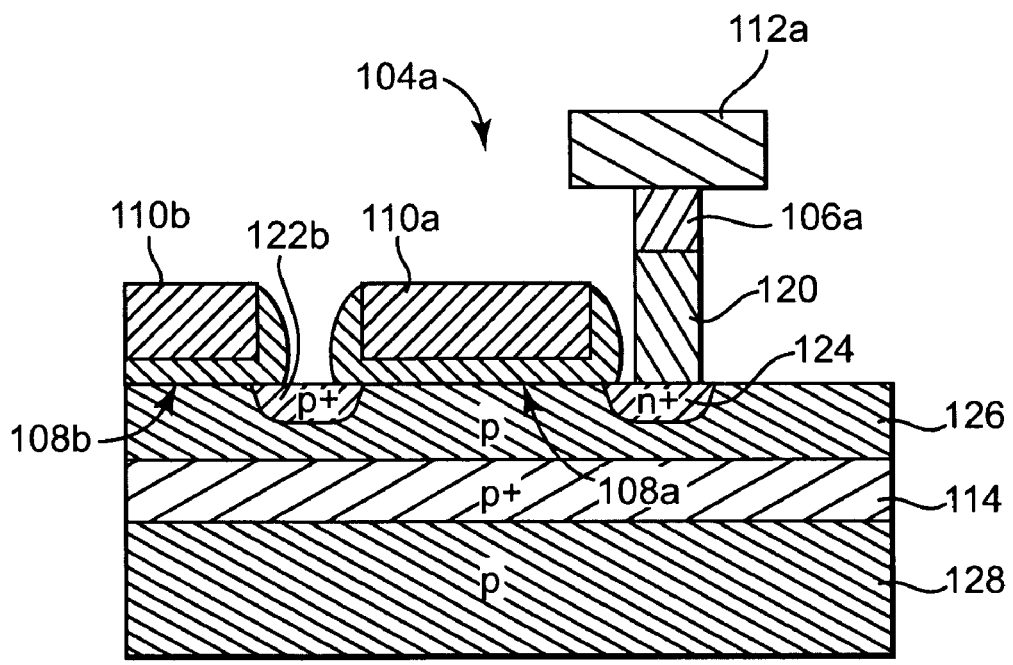
FIG. 3 is a diagram illustrating another embodiment of a phase change memory cell.

FIG. 3 illustrates another embodiment of phase change memory cell 104a and a portion of phase change memory cell 104b. In one embodiment, each phase change memory cell 104 in memory array 100 is similar to the embodiment of phase change memory cell 104a illustrated in FIG. 3. This embodiment is similar to the embodiment previously described and illustrated with reference to FIG. 2, except that in this embodiment, source 122b does not contact p+ ground plate region 114. The distance between source 122b and p+ ground plate region 114 across p region 126 adds a series resistance between source 122b and p+ ground plate region 114.

Figure 4:
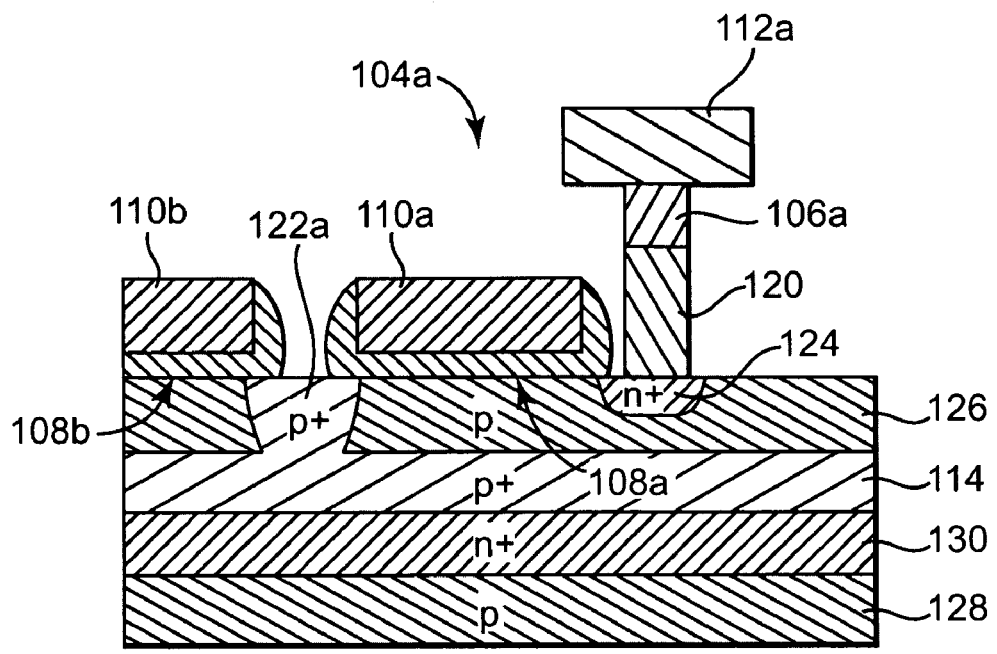
FIG. 4 is a diagram illustrating another embodiment of a phase change memory cell.

FIG. 4 is a diagram illustrating another embodiment of phase change memory cell 104a and a portion of phase change memory cell 104b. In one embodiment, each phase change memory cell 104 in memory array 100 is similar to the embodiment of phase change memory cell 104a illustrated in FIG. 4. This embodiment is similar to the embodiment previously described and illustrated with reference to FIG. 2, except that in this embodiment, an n+ region 130 is positioned between p+ ground plate region 114 and p region 128. N+ region 130 isolates p+ ground plate region 114 from p region 128 to prevent noise from passing to p region 128 of the semiconductor wafer. In one embodiment, n+ region 130 also isolates TFETs 108 from source regions of periphery transistors outside memory array 100, such as bit line selection transistors, which may have a different source bias.

Figure 5:
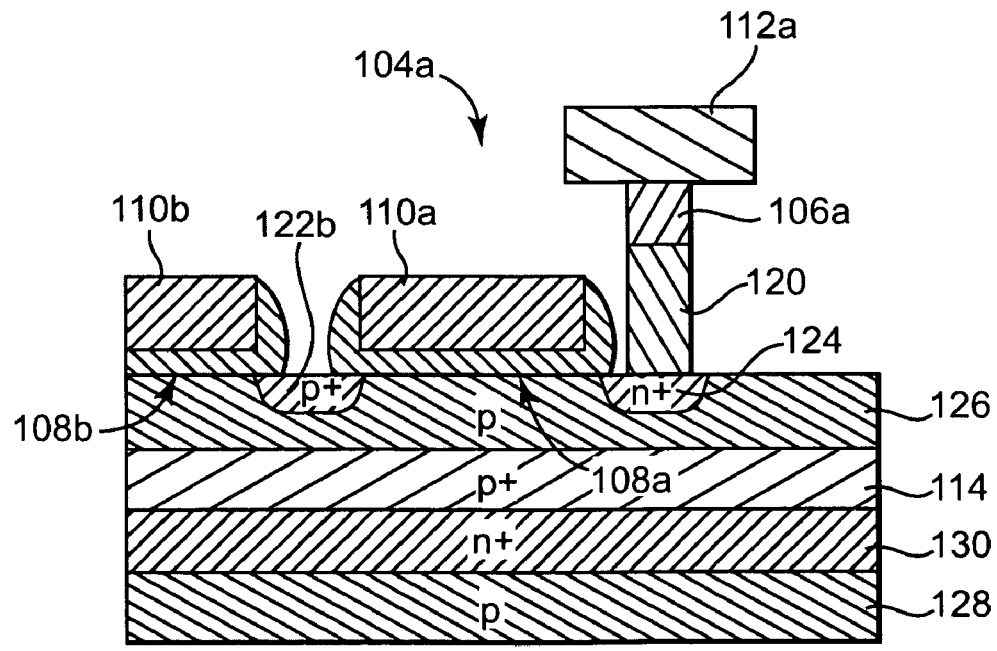
FIG. 5 is a diagram illustrating another embodiment of a phase change memory cell.

FIG. 5 is a diagram illustrating another embodiment of phase change memory cell 104a and a portion of phase change memory cell 104b. In one embodiment, each phase change memory cell 104 in memory array 100 is similar to the embodiment of phase change memory cell 104a illustrated in FIG. 5. This embodiment is similar to the embodiment previously described and illustrated with reference to FIG. 4, except that in this embodiment, source 122b does not contact p+ ground plate region 114. The distance between source 122b and p+ ground plate region 114 across p region 126 adds a series resistance between source 122b and p+ ground plate region 114.

Figure 6:
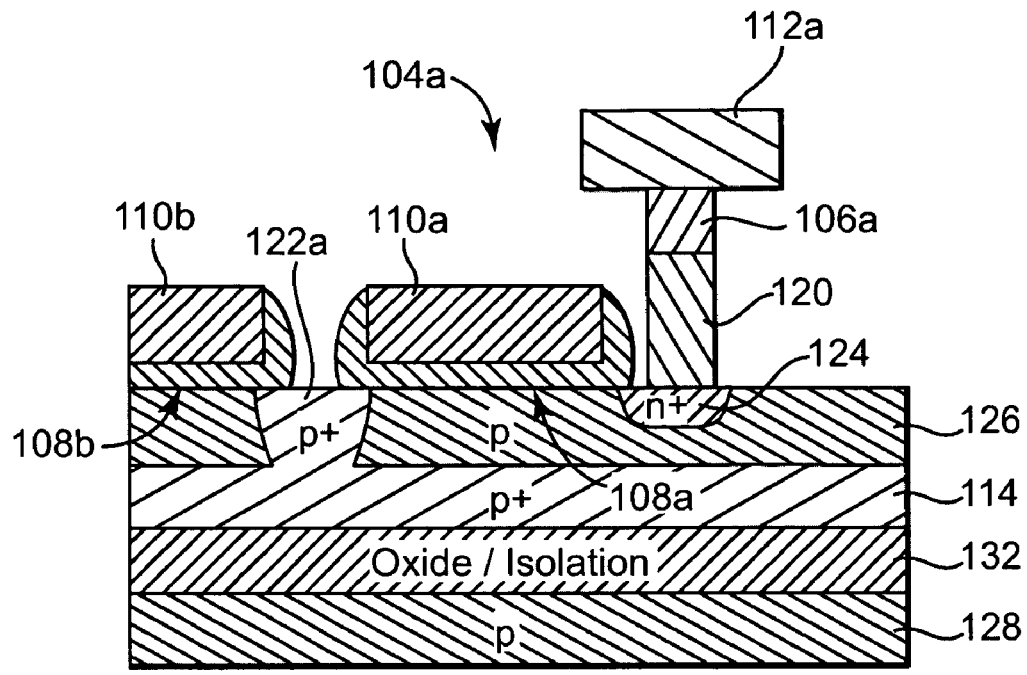
FIG. 6 is a diagram illustrating another embodiment of a phase change memory cell.

FIG. 6 is a diagram illustrating another embodiment of phase change memory cell 104a and a portion of phase change memory cell 104b. In one embodiment, each phase change memory cell 104 in memory array 100 is similar to the embodiment of phase change memory cell 104a illustrated in FIG. 6. This embodiment is similar to the embodiment previously described and illustrated with reference to FIG. 2, except that in this embodiment, an oxide/isolation region 132 is positioned between p+ ground plate region 114 and p region 128. Oxide/isolation region 132 comprises $SiO_2$, borophosphosilicate glass (BPSG), borosilicate glass (BSG), low-k material, or other suitable dielectric material. Oxide/isolation region 132 isolates p+ ground plate region 114 from p region 128 to prevent noise from passing to p region 128 of the semiconductor wafer. In one embodiment, oxide/isolation region 130 also isolates TFETs 108 from source regions of periphery transistors outside memory array 100, such as bit line selection transistors, which may have a different source bias.

In another embodiment, the doping types are reversed to provide p-channel TFETs 108 instead of n-channel TFETs 108. In this embodiment, source 122a and source or ground plate region 114 are switched from p+ doping to n+ doping, drain 124 is switched from n+ doping to p+ doping, and region 126 is switched from p doping to n doping.

Figure 7:
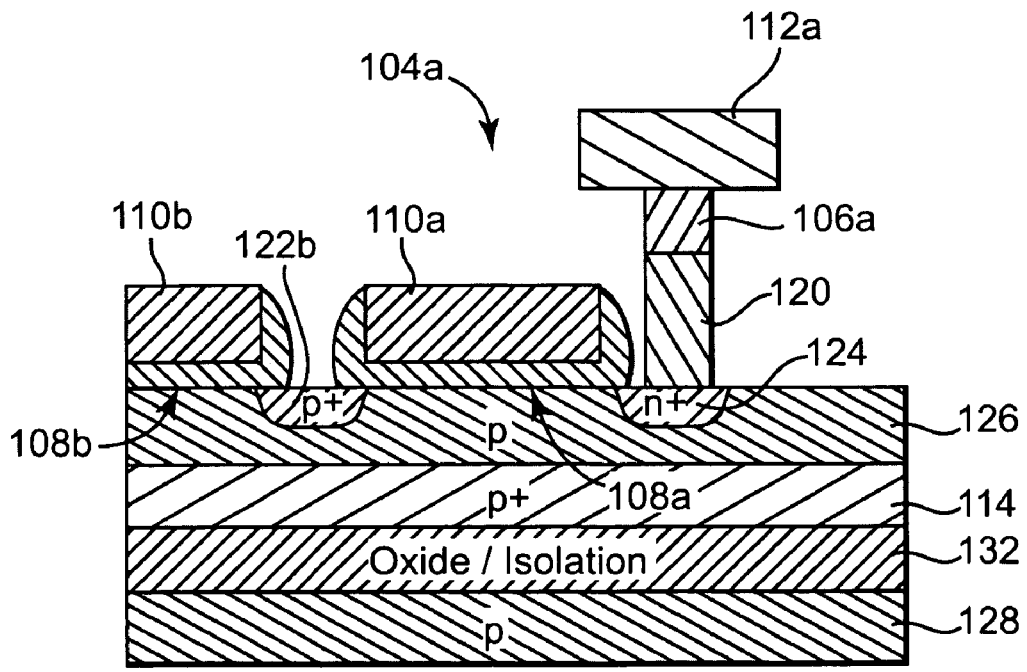
FIG. 7 is a diagram illustrating another embodiment of a phase change memory cell.

FIG. 7 is a diagram illustrating another embodiment of phase change memory cell 104a and a portion of phase change memory cell 104b. In one embodiment, each phase change memory cell 104 in memory array 100 is similar to the embodiment of phase change memory cell 104a illustrated in FIG. 7. This embodiment is similar to the embodiment previously described and illustrated with reference to FIG. 6, except that in this embodiment, source 122b does not contact p+ ground plate region 114. The distance between source 122b and p+ ground plate region 114 across p region 126 adds a series resistance between source 122b and p+ ground plate region 114.

Embodiments of the present invention provide TFET based resistive memory cells. Adjacent TFETs share a source region that is coupled to adjacent memory cells via a p+ ground plate region within the semiconductor wafer. Without source or ground lines and their associated contacts to the source regions of the TFETs, the word lines between adjacent memory cells can be positioned closer together. With the word lines positioned closer together, the memory cell size can be reduced thereby increasing the storage density of the memory. In addition, the TFETs reduce the static leakage current of the memory cells compared to memory cells that use MOSFETs, thereby reducing the power consumption of the memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a first tunneling field effect transistor including a first drain and a first p+ doped source, the first drain coupled to a first MRAM memory element;
   a second tunneling field effect transistor including a second drain and a second p+doped source, the second drain coupled to a second MRAM memory element; and
   a p+ doped ground plate region coupled to the first p+ doped source and the second p+doped source.

2. A memory comprising:
   a first MRAM memory element;
   a second MRAM memory element;
   a first tunneling field effect transistor including a first p+ doped source, the first tunneling field effect transistor for accessing the first MRAM memory element;
   a first word line coupled to a gate of the first tunneling field effect transistor;
   a second tunneling field effect transistor including a second p+ doped source, the second tunneling field effect transistor for accessing the second MRAM memory element;
   a second word line coupled to a gate of the second tunneling field effect transistor; and
   a p+ doped ground plate region coupled to the first p+ doped source and the second p+doped source.

3. A method for fabricating a memory, the method comprising:
   providing a first tunneling field effect transistor including a first drain and a first p+doped source;
   providing a first MRAM memory element coupled to the first drain;
   providing a second tunneling field effect transistor including a second drain and a second p+ doped source;
   providing a second MRAM memory element coupled to the second drain; and
   providing a p+ doped ground plate region coupled to the first p+ doped source and the second p+ doped source.

4. An integrated circuit including an array of MRAM memory cells comprising:
   a first tunneling field effect transistor including a first n+ doped drain, the first n+ doped drain coupled to a first MRAM memory element;
   a second tunneling field effect transistor including a second n+ doped drain; and
   a p+ doped ground plate region comprising p+ doped sources for the first and second tunneling field effect transistors.

* * * * *